United States Patent [19]

Takahashi

[11] Patent Number: 4,803,444
[45] Date of Patent: Feb. 7, 1989

[54] PROXIMITY SWITCH

[75] Inventor: Fumito Takahashi, Kanagawa, Japan

[73] Assignee: Fuji Electric Co., Ltd., Kanagawa, Japan

[21] Appl. No.: 127,403

[22] Filed: Dec. 2, 1987

[30] Foreign Application Priority Data

Jan. 14, 1987 [JP] Japan .................................. 62-6732

[51] Int. Cl.⁴ ............................................. H03B 5/12
[52] U.S. Cl. ................................. 331/65; 331/117 R; 324/236
[58] Field of Search ..................... 331/65, 117 R, 167; 324/119, 236, 327

[56] References Cited

U.S. PATENT DOCUMENTS 4,613,830 9/1986 Kamiya et al. ........................ 331/65

FOREIGN PATENT DOCUMENTS 61-35619 2/1986 Japan .

Primary Examiner—Eugene R. LaRoche
Assistant Examiner—Robert J. Pascal
Attorney, Agent, or Firm—Finnegan, Henderson, Farabow, Garrett, & Dunner

[57] ABSTRACT

A proximity switch including a high-frequency oscillation device, including a detection coil, for generating an output signal which represents the detection of the approach of an object. A rectification device is included for rectifying and smoothing the output signal from the high-frequency oscillation device to generate an output signal. A feedback device feeds back the output signal from the rectification device to the high-frequency oscillation device. An output device generates a signal when the quantity of the feedback by the feedback device has exceeded a predetermined value. The signal generated by the output device representing the approach of the object.

6 Claims, 1 Drawing Sheet

PROXIMITY SWITCH

BACKGROUND OF THE INVENTION

The present invention relates to a proximity switch of the high-frequency oscillation type, which generates a detection signal when an object to be detected approaches the switch.

A conventional proximity switch of the high-frequency oscillation type has a detection coil in a detection head and the detection coil acts as the resonance coil of an oscillation circuit. An object is detected in terms of the drop in the output from the oscillation circuit.

FIG. 1 shows an oscillation circuit of the current feedback type for such a proximity switch. As shown in FIG. 1, a capacitor 2 is connected in parallel with a detection coil 1 provided in the front portion of the proximity switch, so that a resonance circuit 3 is constituted. An electrical current is applied to the resonance circuit 3 by a power supply 5 through a constant current circuit 4. One terminal of the power supply 5 is connected to a transistor 6 so that current amplification is performed. The emitter of the transistor 6 is grounded through a variable resistor 7 which functions to determine the magnitude of the collector current of the transistor. A current mirror circuit 12 including transistors 10 and 11 connected to emitter resistors 8 and 9, is connected to the collector of the transistor 6. The magnitude of an electrical current obtained from the resonance circuit 3 is subjected to the current amplification by the transistor 6. The magnitude of an electrical current, which is the same as that of the collector current of the transistor 6, is subjected to current feedback to the resonance circuit 3 through a transistor 11 by the current mirror circuit 12. Since positive current feedback is thus performed, oscillation is started at the resonance frequency of the resonance circuit 3. A smoothing capacitor 13 is provided to control power supplied to the resonance circuit 3. The oscillation stoppage speed of the oscillation circuit can be changed by altering the form of the detection coil 1 the number of turns thereof (for example, changing) or the other constants of the circuit. When an object to be detected approaches the proximity switch, the conductance of the detection coil 1 increases so that the the oscillation circuit oscillating stop oscillating. When the object goes away from the proximity switch, the oscillation begins again. The sum of the speed of the oscillation stoppage and the oscillation growth of the oscillation circuit is the response speed of the proximity switch.

Although the speed of the oscillation stoppage of the high-frequency oscillation circuit described above is generally high, the circuit has a drawback in that the speed of the oscillation growth of the circuit is very low. Thus, the high-frequency oscillation circuit disadvantageous that when the detection coil is increased in size, the response speed of the circuit decreases rendering impossible to accurately detect the approach of a quickly moving or changing object.

In order to solve the above-mentioned problem, an invention was made and disclosed in the Japanese Patent Application (OPI) No. 35619/86 (the term "OPI" as used herein means an "unexamined published application"). According to the invention, oscillation does not stop but continues at a low level when an object to be detected approaches a detection coil. However, the low level at which the oscillation continues despite the approach of the object must be exact and cannot fluctuate due to the change in the ambient temperature. Therefore, the invention is a disadvantages in that it is not practical for a proximity switch used in a rough environment.

SUMMARY OF THE INVENTION

Accordingly, it is an object of the present invention to provide a proximity switch having a high response speed.

The proximity switch comprises a high-frequency oscillation circuit having a detection coil for detecting the approach of an object; a rectification circuit which rectifies and smooths the output from the high-frequency oscillation circuit; a feedback circuit for feeding back the output from the rectification circuit to to the high-frequency oscillation circuit; and an output circuit which receives the quantity of the feedback by the feedback circuit so as to generate a signal when the quantity of the feedback has exceeded a prescribed value, to indicate an approach of the object.

The output from the high-frequency oscillation circuit is converted into a DC signal by the rectification circuit, the output from which is fed back to the high-frequency oscillation circuit to keep the output from the high-frequency oscillation circuit constant. The approach of an object is detected on the basis of the quantity of the feedback. For that reason, the response speed of the proximity switch to the approach of an object is high.

A signal corresponding to the change in the oscillation voltage of the high-frequency oscillation circuit is rectified by the rectification circuit and then fed back to the high-frequency oscillation circuit through the feedback circuit so that the oscillation voltage does not drop even if the object approaches the detection coil. For this reason, the oscillation of the high-frequency oscillation circuit does not stop.

The output signal of the proximity switch can be generated by using a comparator to detect the quantity of the feedback from the feedback circuit.

Although the oscillation voltage of the high-frequency oscillation circuit begins to grow from 0 V when electric power is applied to the proximity switch, the time of the growth of the oscillation voltage is greatly shortened because the quantity of the feedback is large at the time of the application of the electric power to the switch. For this reason, the response speed of the proximity switch is high.

DETAILED DESCRIPTION OF EXEMPLARY EMBODIMENT

Figure 1:
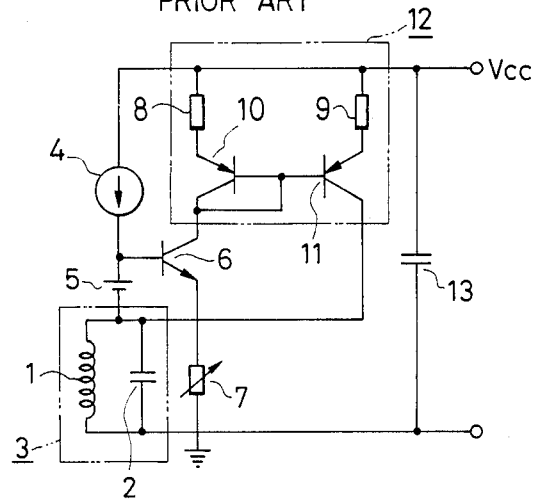
FIG. 1 shows a wiring diagram of a conventional proximity switch.
Figure 2:
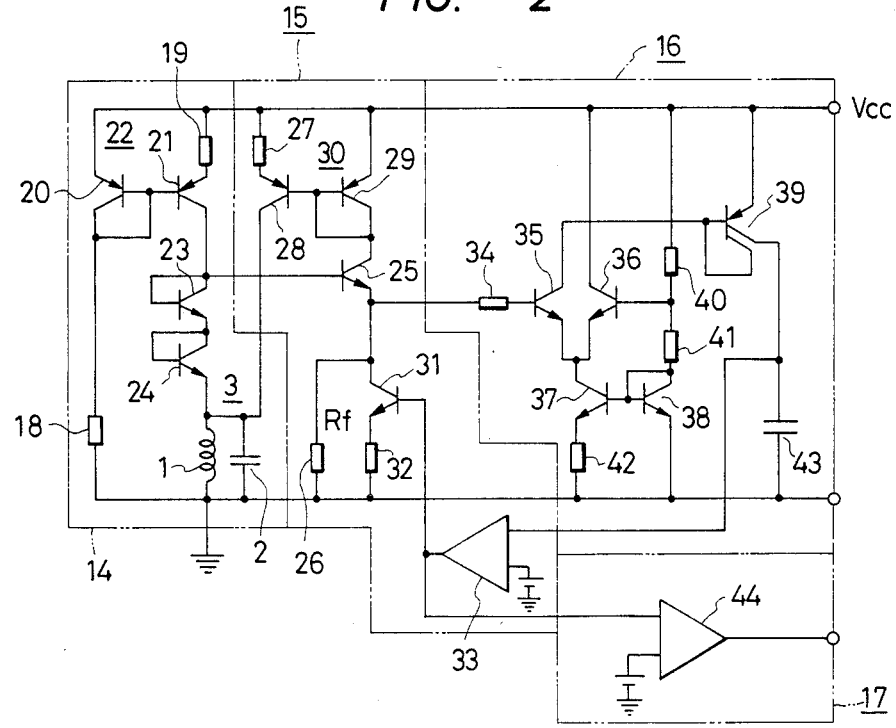
FIG. 2 shows a wiring diagram of a proximity switch which is an embodiment of the present invention.

An embodiment of the present invention will be hereafter described in detail with reference to FIG. 2 showing a wiring diagram of the proximity switch. The proximity switch comprises a high-frequency oscillation circuit 14, a feedback circuit 15, a rectification circuit 16 and an output circuit 17.

In the high-frequency oscillation circuit 14, a resonance circuit 3 is composed of a detection coil 1 and a capacitor 2. An electrical current is supplied through level shift diodes 23 and 24 from a current mirror circuit 22 composed of resistors 18 and 19 and transistors 20 and 21.

The feedback circuit 15 subjects the output from the oscillation circuit 14 to current amplification and then feeds the amplified output back to the oscillation circuit through the rectification circuit 16. The feedback circuit 15 comprises a transistor 25 whose base is connected to the point of the interconnection of the transistor 21 and the level shift diode 23, an emitter resistor 26 connected to the emitter of the transistor 25, a current mirror circuit 30 composed of a resistor 27 and transistors 28 and 29, a series circuit composed of a resistor 32 and a transistor 31 connected in parallel with the emitter resistor 26, and an operational amplifier 33 whose output terminal is connected to the base of the transistor 31 and whose input terminal is connected to the output terminal of the rectification circuit 16. An electrical current is supplied from a control power supply Vcc to the feedback circuit 15 through the current mirror circuit 30. A circuit comprising the emitter resistor 26, the transistor 31 and the resistor 32 acts to determine the magnitude of the collector current of the transistor 25. The collector current of the transistor 25 acts so that an electrical current of the same magnitude as the collector current is fed back to the resonance circuit 3. In other words, the oscillation voltage of the resonance circuit 3 changes depending on the resistance Rf of the circuit comprising the emitter resistor 26, the transistor 31 and the resistor 32. The oscillation voltage is low when the resistance Rf is high. The oscillation voltage is high when the resistance Rf is low. The resistance Rf changes depending on whether or not the transistor 31 is turned on by the output from the operational amplifier 33.

The rectification circuit 16 functions so that the voltage across the emitter resistor 26 is amplified, rectified and smoothed. The rectification circuit 16 comprises a transistor 35 connected to the emitter of the transistor 25 through a resistor 34, transistors 36, 37, 38 and 39, resistors 40, 41 and 42 and a capacitor 43. The amplification and rectification are performed by the transistors 35, 36, 37, 38 and 39 and the resistors 40, 41 and 42. The smoothing is performed by the capacitor 43.

The output circuit 17 is made of a comparator 44, one input terminal of which is connected to the output terminal of the operational amplifier 33. The output terminal of the comparator 44 serves as that of the proximity switch.

When the oscillation circuit 14 is oscillating, the output therefrom is amplified by the transistors 25 and 35, rectified by the rectification circuit 16, smoothed by the capacitor 43 and applied to the transistor 31 through the operational amplifier 33. Since the voltage thus applied to the transistor 31 is low, the transistor is always off, so that the oscillation circuit is stably oscillating. Since the input voltage to the comparator 44 is low, the output circuit 17 generates no signal.

When an object to be detected approaches the detection coil 1, the oscillation voltage of the oscillation circuit 14 drops. At that time, the output voltage of the rectification circuit 16 also drops, the voltage across the capacitor 43 falls, and the output voltage of the operational amplifier 33 rises so that the transistor 31 is turned on. As a result, the resistor 32 is connected in parallel with the resistor 26 so that the combined resistance Rf decreases. For that reason, the oscillation output from the oscillation circuit 14 increases so that the voltage across the capacitor 43 is kept nearly constant. However, since the output voltage of the operational amplifier 33 has already become high, the output voltage is applied to the comparator 44 so that a signal indicative of the detection of the object is obtained from the output circuit 17 and used as the output signal of the proximity switch.

What is claimed is:

1. A proximity switch comprising:
   high-frequency oscillation means including a detection coil for generating an output voltage signal when an object approaches said detection coil;
   rectification means for rectifying and smoothing said output voltage signal from said high-frequency oscillation means into a feedback signal;
   feedback means for feeding back said feedback signal from said rectification means to said high-frequency oscillation means to maintain said output voltage signal substantially constant; and
   output means for generating a detection signal when the quantity of feedback by said feedback means exceeds a predetermined value, said detection signal generated by said output means indicating detection of said approaching object.

2. A proximity switch as claimed in claim 1, wherein said high-frequency oscillation means includes a resonance means composed of said detection coil and a capacitor.

3. A proximity switch as claimed in claim 1, wherein said rectification means comprises a rectification circuit for rectifying said output voltage signal from said high-frequency oscillation means, and a capacitor for smoothing the rectified output voltage signal.

4. A proximity switch comprising:
   high-frequency oscillation means including a detection coil for generating an output voltage signal when an object approaches said detection coil;
   rectification means for rectifying and smoothing said output voltage signal from said high-frequency oscillation means into a feedback signal;
   feedback means for feeding back said feedback signal from said rectification means to said high-frequency oscillation means to maintain said output voltage signal substantially constant;
   output means for generating a detection signal when the quantity of feedback by said feedback means exceeds a predetermined value, said detection signal generated by said output means indicating detection of said approaching object;
   wherein said high-frequency oscillation means includes a resonance means composed of said detection coil and a capacitor; and
   wherein said feedback means comprises a circuit having a resistance and including a transistor means and a resistor means, said resonance means being dependent on the value of said resistance such that an oscillation voltage of said resonance means is low when said resistance is high, and said oscillation voltage of said resonance means is high when said resistance is low.

5. A proximity switch as claimed in claim 4, wherein said feedback means further comprises an operational amplifier having an output terminal connected to a base terminal of said transistor and an input terminal connected to an output terminal of said rectification means, such that said transistor is rendered conductive when an output voltage of said operational amplifier exceeds said predetermined value.

6. A proximity switch as claimed in claim 5, wherein said output means comprises a comparator having an input terminal connected to said output terminal of said operational amplifier, and an output terminal for outputting said detection signal when said output voltage of said operational amplifier exceeds said predetermined value.

* * * * *